(12) United States Patent
Charles

(10) Patent No.: US 6,289,030 B1
(45) Date of Patent: Sep. 11, 2001

(54) FABRICATION OF SEMICONDUCTOR DEVICES

(75) Inventor: Paul Marshall Charles, Bramford (GB)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/015,010

(22) Filed: Jan. 28, 1998

(30) Foreign Application Priority Data

Jan. 31, 1997 (EP) .................................................. 97300645

(51) Int. Cl.⁷ .......................... G01S 5/28; H01L 30/0232; H01L 21/00
(52) U.S. Cl. ................................ 372/49; 257/437; 438/29
(58) Field of Search ...................... 372/49; 257/433–437; 438/29, 42, 43, 44

(56) References Cited

U.S. PATENT DOCUMENTS

| | | |
|---|---|---|
| 4,749,255 | 6/1988 | Chakrabarti et al. . |
| 5,185,290 | 2/1993 | Aoyagi et al. . |
| 5,258,991 | 11/1993 | Peterson . |
| 5,677,922 * | 10/1997 | Hayafuji et al. ........................ 372/49 |

FOREIGN PATENT DOCUMENTS 0416190    3/1991   (EP) .

OTHER PUBLICATIONS

"Optimization of Highly Efficient Uncoated Strained 1300–nm InGaAsP MQW Lasers For Uncooled High–Temperature Operation" W. S. Ring et al, Technical Digest Optical Fiber Conference 1995 No Month.

"Reactive Ion Etching of Low–Loss Mirrors In InP/InGaAsP/InP Heterostructures Using $Ch_4/H_2/O_2$ Chemistry" by S. E. Hicks, et al., Proceeding of the European Conference on Integrated Optoelectronics, 1993, No Month pp. 2–36 to 2–37.

S. N. Ojha and S. J. Clements in "Etching of Low–Loss Mirrors For Photonic IC's" Fifth International Conference on Indium Phosphide and Related Materials, Apr. 19–22, 1993 Paris, France.

* cited by examiner

Primary Examiner—James W. Davie

(57) ABSTRACT

A method of fabricating a semiconductor optical device is provided comprising the steps of depositing planar layers of semiconductor material to form a semiconductor wafer having an optically active region, etching through the optically active region to form a plurality of facets, and simultaneously coating at least one facet and an upper surface of the semiconductor wafer with a coating layer having a thickness and composition such that, during operation of the semiconductor device, the coating layer acts both as a facet coating and as a wafer surface coating. Where the coating layer comprises a dielectric, the layer acts both as an anti-reflection facet coating and as a passivating layer. Where the coating layer comprises a metal, the layer acts both as a high-reflectivity facet coating and as an electrical contacting layer. In a first embodiment the semiconductor device comprises a laser and in a second embodiment comprises a photodetector.

32 Claims, 14 Drawing Sheets

FABRICATION OF SEMICONDUCTOR DEVICES

TECHNICAL FIELD

The present invention relates to semiconductor optical devices, and to methods of fabricating such devices, and in particular relates to facet coated semiconductor devices and methods of fabricating such facet coated semiconductor devices.

BACKGROUND OF THE INVENTION

Semiconductor devices, for example semiconductor lasers and photodetectors, find many applications for example in the fields of optical data storage, printing and communications. Such wide spread use of semiconductor devices has lead to great demand for semiconductor devices fabrication techniques which are suitable for producing high performance devices in large volumes and at low cost.

A key element which determines the performance of a semiconductor laser is whether or not its output facets are coated and for a photodetector whether or not its input facets are coated. An uncoated semiconductor laser facet will typically have a reflectivity of approximately 30%. This reflectivity is often not optimum for the performance of the laser. The facets of semiconductor lasers are thus often coated with for example a high reflectivity (HR) coating, or a low or anti-reflectivity (AR) coating, or both. DFB (Distributed Feed Back) lasers, particularly if a phase shift in the grating is incorporated, require that both facets are coated with an AR coating in order to suppress Fabry-Perot modes and to ensure lasing at the grating determined wavelength. High power semiconductor lasers conversely are often coated at one facet with an HR coating and at the other facet with an AR coating. Facet coating semiconductor lasers can lead to better high temperature performance, lower threshold currents, and more efficient operation.

Despite these advantages facet coating is rarely used for example in the telecommunications industry for higher volume, lower cost semiconductor lasers due to the increase in fabrication costs caused by the facet coating processes. Semiconductor lasers are grown on a wafer by depositing a number of semiconductor layers, and etching a structure into these layers, then coating the upper surface of the wafer with dielectric and metal layers to allow the lasers to be electrically contacted. Conventionally, the wafer of semiconductor lasers is then cleaved to form many fragile bars of semiconductor lasers, and these bars are held together to expose the laser facets which are coated with a facet coating to alter their facet reflectivity. Care must be taken to shield the upper and lower surfaces of the lasers so as to avoid the facet coating material being deposited on these surfaces and impeding electrical contacts with the lasers. This prior art technique for facet coating thus involves the handling and accurate alignment of many fragile semiconductor bars and consequently increases fabrication costs considerably and reduces fabrication yields.

U.S. Pat. No. 5,185,290 discloses a method in which conventionally formed semiconductor lasers are etched, while still on the wafer, to form a laser facet and these lasers facets are subsequently coated. While this technique addresses some of the problems of facet coating lasers, it remains a complex and expensive fabrication technique.

BRIEF DESCRIPTION OF THE INVENTION

It is an aim of the present invention to, at least to some extent, simplify conventional techniques for fabricating facet coated semiconductor devices.

According to the present invention there is provided a method of fabricating a semiconductor optical device comprising the steps of depositing planar layers of semiconductor material to form a semiconductor wafer having an optically active region, etching through the optically active region to form a plurality of facets, and simultaneously coating at least one facet and an upper surface of the semiconductor wafer with a coating layer having a thickness and composition such that, during operation of the semiconductor device, the coating layer acts both as a facet coating and as a wafer surface coating. The Applicants have discovered that by a suitable choice of coating material and thickness a single coating process can yield a coating layer which is effective both as a facet coating and as a wafer surface coating.

In accordance with one embodiment of the invention, the deposited layers of semiconductor material form a semiconductor wafer having a light absorbing region and input facets for the semiconductor optical device are etched. For example, an edge-entry photodetector may be fabricated in which a single coating layer is applied to both the etched input facet and the upper wafer surface.

According to a further embodiment, the deposited planar layers of semiconductor material form a semiconductor wafer having a light emitting region and output facets for the semiconductor optical device are etched. For example, a facet coated laser may be fabricated by simultaneously coating both the facet of a laser and its upper surface with a coating layer which has a dual purpose.

In embodiments of the present invention the coating layer comprises a dielectric material. In this case the part of the coating layer on the laser output facet or photodetector input facet may act as an AR coating, while the part of the coating on the upper surface of the laser may act as a passivating layer. In appropriate laser structures, this layer may also act as a current confining layer: for example, in structures which have oxide windows as the sole means of current confinement.

Alternatively the coating layer may comprise a metal material, in which case the coating layer acts as a high reflectivity coating over the facet, and as an electrical contacting coating when on the wafer upper surface.

Preferably, in accordance with embodiments of the present invention, a first dielectric coating layer is deposited on both the facet and the upper surface of the semiconductor wafer, and is followed by a second metal layer again deposited on both the laser facet and the upper surface of the semiconductor wafer.

Advantageously, the metal layer, or both the metal layer and the dielectric layer, may be removed from one or both of the laser facets to leave an HR or AR coating as required.

The standard dielectric and metal layers which in prior art semiconductor lasers are utilized only as wafer surface coatings have been found to be effective also as facet coatings. Prior art fabrication processes have required that dielectric and metal layers are first deposited on semiconductor wafers respectively for passivation and electrical contacting and facets are only then subsequently etched. These etched facets may then require one or more coating processes for example to passivate the facets or to apply AR or HR coatings. Care must be taken in this second coating process to ensure that coatings intended for the facets are not deposited on the wafer surface, or, if deposited there, are subsequently removed so as not to affect the prior deposited wafer coatings. In contrast, according to embodiments of the present invention, a coating which is effective on both the upper surface of the semiconductor wafer and the facet can be deposited in a single step.

It will be appreciated that the present invention simplifies the fabrication of semiconductor devices having etched facets, and that the techniques of the invention may be applied to semiconductor devices that have a light emitting region, a light absorbing region or a region that both emits and absorbs light, for example as do semiconductor optical amplifiers.

BRIEF DESCRIPTION OF THE DRAWINGS

Embodiments of the present invention will now be described, by way of example only and with reference to the accompanying diagrams, in which.

DETAILED DESCRIPTION OF A LASER EMBODIMENT

Figure 1:
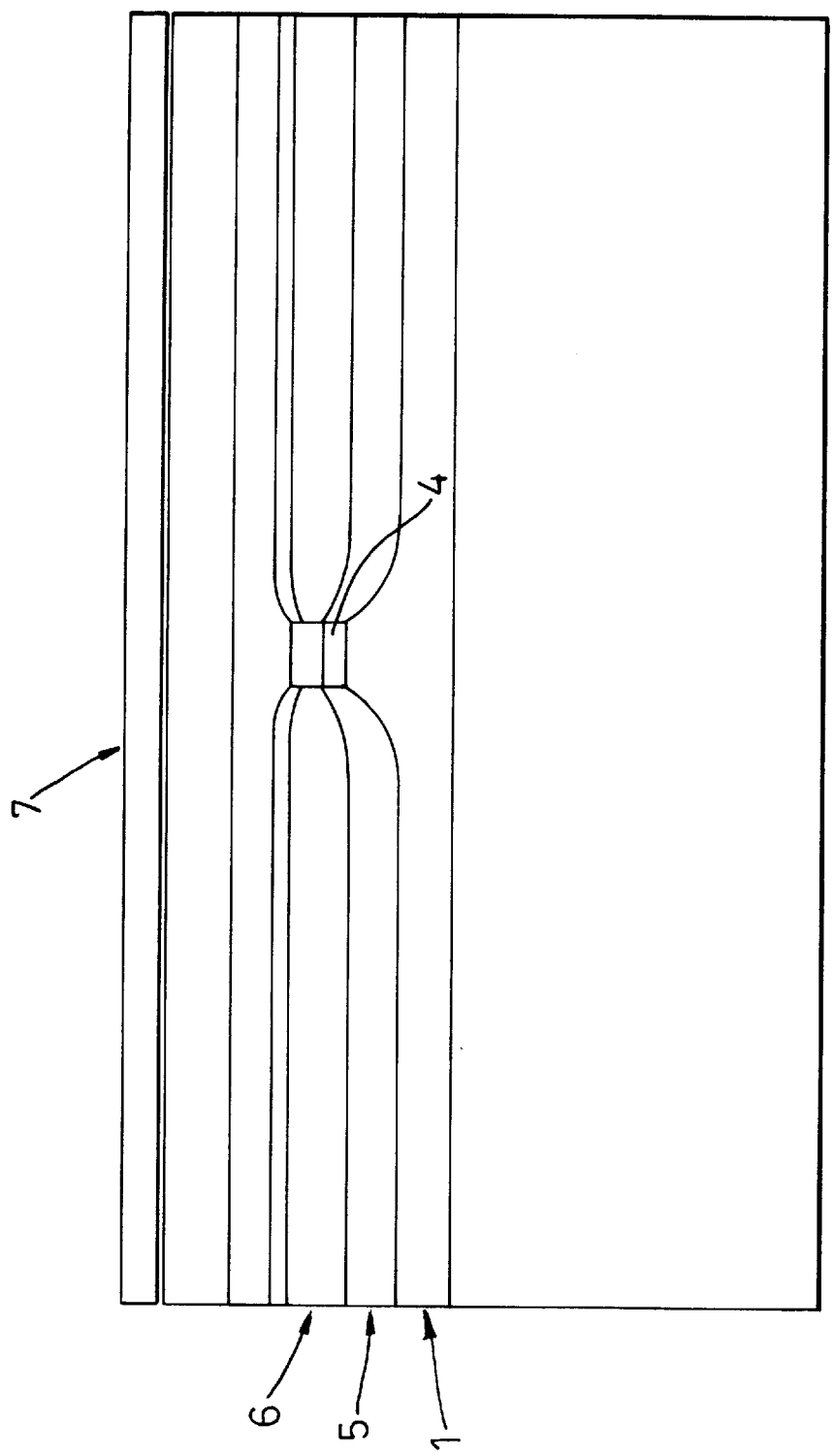
FIG. 1 is a schematic diagram of a conventional buried heterostructure semiconductor laser.

An overview of the fabrication of a semiconductor laser according to a first embodiment of the present invention will first be given, followed by a detailed description of the fabrication process steps.

A semiconductor laser source wafer (sometimes known as a planar) is grown by any one of a number of known techniques, however the normally deposited passivating and electrical contacting layers are not deposited. Laser facets are etched substantially at 90° to the upper surface of the semiconductor wafer and a coating of dielectric material is deposited on both the laser facets and the upper surface of the semiconductor wafer. An electrical contact window is opened in the dielectric layer above the active region of the semiconductor laser. A metal layer is deposited on both the laser facets and the semiconductor wafer surface. In accordance with the nature of the semiconductor lasers that it is desired to fabricate, selected facet coatings (but not wafer surface coatings) are removed by a masking and etching process. Thus, for any particular facet, both layers, only the metal layer or neither layer may be removed resulting in respectively an uncoated, an AR coated or an HR coated facet. Semiconductor lasers can be chosen to have any combination of these three types of facets at either end of the laser in order to optimize their performance.

1. Semiconductor Planar Growth

This embodiment of the invention utilizes a buried heterostructure laser, however, any of the known alternative semiconductor laser structures may be employed such as a ridge waveguide structure. The buried heterostructure employed is entirely conventional except for a somewhat thicker capping layer as will be described below.

A strained multi quantum well (SMQW) InP/InGaAsP buried heterostructure (BH) Fabry-Perot structure, as described for example in "Optimization of highly efficient uncoated strained 1300-nm InGaAsP MQW lasers for uncooled high-temperature operation" W. S. Ring et al., Technical Digest Optical Fiber Conference 1995, is grown. The semiconductor planar comprises a buffer layer 1 of InP, an active layer of seven InGaAsP wells separated by six InGaAsP barriers, and a confinement layer 3. An active area is masked and etched to form a mesa in a conventional manner in the form of an active mesa stripe 4. The active mesa stripe 4 is overgrown with blocking layers 5 and 6 to complete the buried heterostructure. A fixed ternary (InGaAs) 7 capping layer is then deposited. This capping layer 7 is approximately 0.5 &m as apposed to the conventional thickness of approximately 0.15 &m. It has been found that this thicker capping layer improves the facet quality of the etched facets.

2. Facet Etching

Figure 2A:
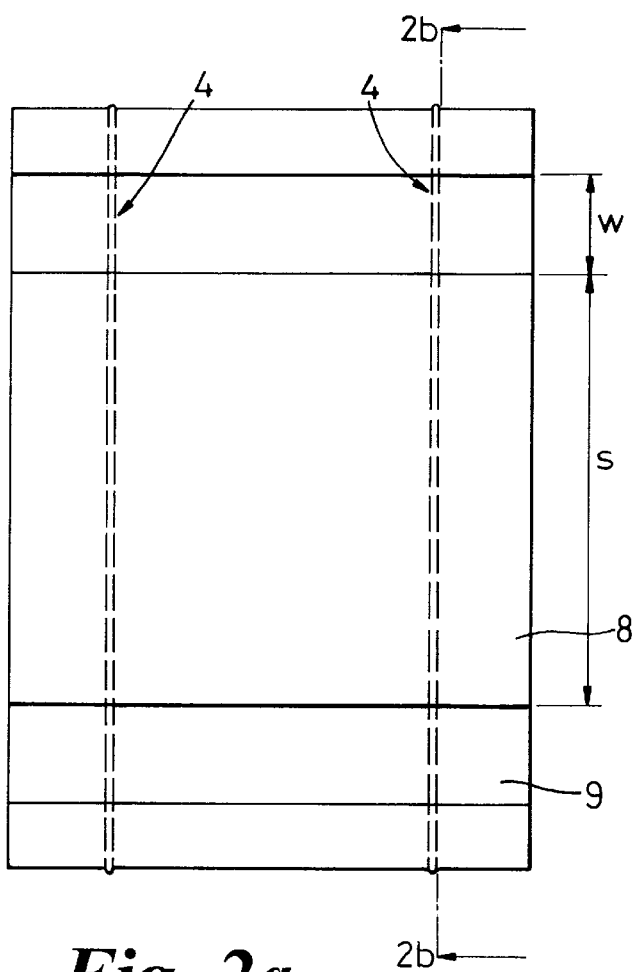
FIG. 2a is a plan view of part of a semiconductor laser wafer fabricated according to a first embodiment of the present invention.
Figure 2B:
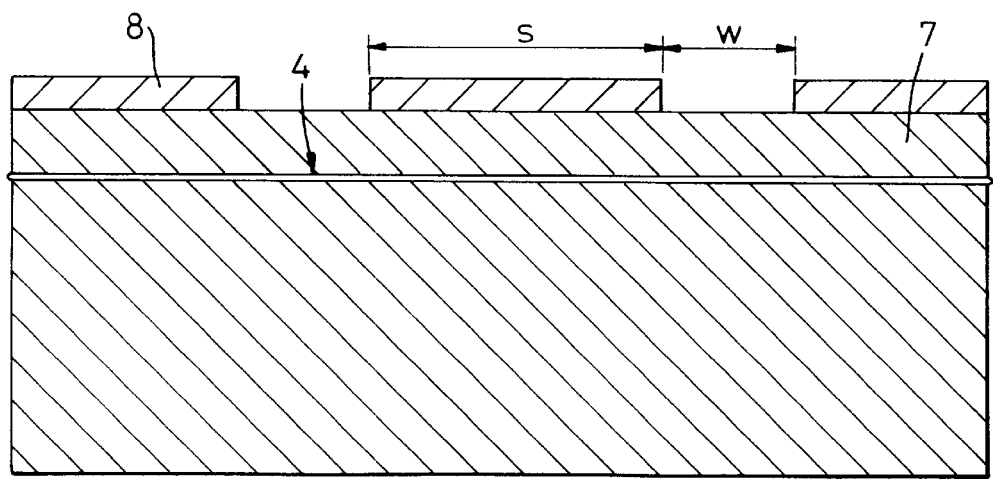
FIG. 2b is a schematic cross-sectional view of the wafer of FIG. 2a, along the line 2b, showing the deposition of a dielectric layer.

FIGS. 2a and 2b respectively show schematic plan and cross-sectional views of a small area of the semiconductor wafer corresponding to a single laser device. In FIG. 2a (and subsequent similar Figures), where useful for understanding of the overall structure the underlying mesa stripes are shown in the dashed lines. A 3,000 Å layer 8 of silicon dioxide is deposited by plasma enhanced chemical vapor deposition (PECVD) across the whole of the semiconductor wafer. A facet mask is used to define the etch channels which, when etched, will define the etched facets of the semiconductor laser. The width of the channels of the facet mask define the separation between successive lasers on the wafer, while the distance between the channels defines the length of each laser. A facet mask having channels of width w=14 &m and separation s=350 &m is utilized in the present embodiment. The facet mask is aligned with the semiconductor wafer so that the facet channels are perpendicular to the direction of the active mesa stripes 4. A resist is deposited through the facet etch mask and conventional $CHF_3/O_2$ reactive ion etching is utilized to etch through the silicon dioxide layer 8 as far as the ternary capping layer 7. The remaining resist is then stripped and the wafer is cleaned in preparation for facet etching.

Figure 3:
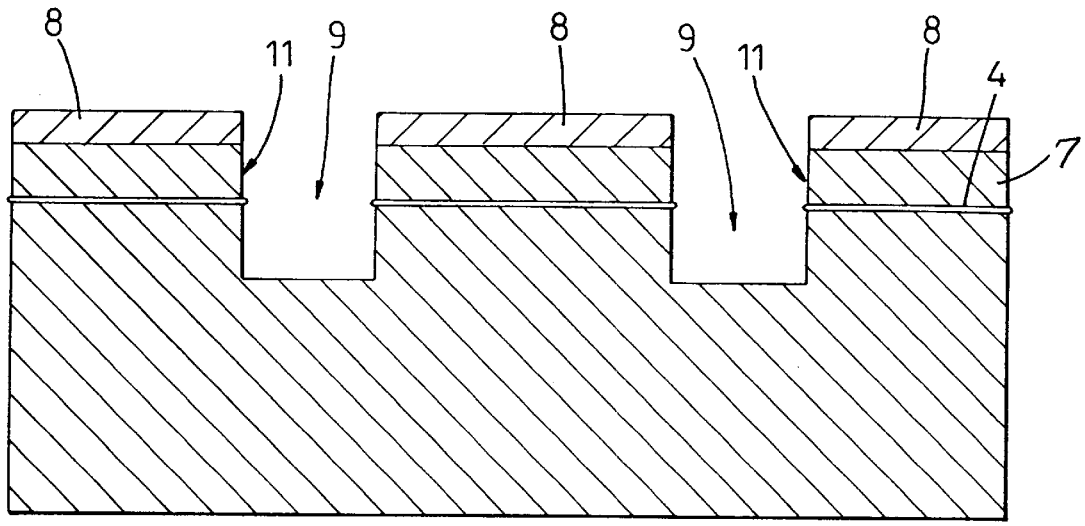
FIG. 3 is a is schematic cross-sectional view of the wafer of FIG. 2 subsequent to the etching of laser facets.

Having transferred the facet etch mask into the silicon dioxide layer 8, this layer can now be used as a mask to etch the facets through the active mesa stripe 4. Reactive ion etching is again used but in this case a gas mixture of $CH_4/H_2/N_2O$ or $CH_4/H_2/CO_2$ is used. It is known to utilize a small amount of oxygen, in the reactive ion etching of indium phosphide based devices, for example "Reactive Ion Etching of Low-Loss Mirrors in InP/InGaAsP/InP Heterostructures Using $CH_4/H_2/O_2$ Chemistry" by S E Hicks et al, Proceedings of the European Conference on Integrated Optoelectronics, 1993, pp2–36 to 2–37, teaches supplying this oxygen in the form of $CO_2$. It is accepted in the semiconductor fabrication field that the use of oxygen with $CH_4/H_2$ RIE facilitates the fabrication of vertical, smooth etched facets. Furthermore, it is thought that the use of oxygen inhibits the undesirable formation of polymer during the etching procedure. Rather than supplying oxygen via $CO_2$, oxygen may be supplied by including a small amount of $N_2O$ in the gas mixture as described by S N Ojha and S J Clements in "Etching of Low-Loss Mirrors for photonic IC's" Fifth International Conference on Indium Phosphide and Related Materials, Apr. 19–22, 1993 Paris, France. As will be appreciated by those skilled in the art, a degree of trial and error optimization may be required to adjust the gas flow ratio of $CH_4$, $H_2$ and $N_2O$ (or $CO_2$) to obtain etched surfaces which are both vertical, relative to the semiconductor wafer surface, and smooth. The Applicants have found flow rates of $CH_4/H_2/N_2O$ of respectively 12, 50, and 0.5 sccm (standard cubic centimeters per minute) are effective. With reference to FIG. 3, facet trenches 9 are etched through the ternary layer 7 and the active layer 4 to a total depth of 10 &m. Following polymer removal by oxygen plasma ashing, the remaining silicon dioxide 8, used as a mask for the facet etching, is then removed by wet chemical etching.

It will be appreciated that the laser facets while substantially at 90° to the upper surface of the semiconductor wafer, may be at an angle other than 90° to the direction of travel of radiation within the laser. For example the laser facets may be at an angle of 87° to this direction in order to further reduce reflections from the facet.

3. Dielectric Layer Deposition

Figure 4:
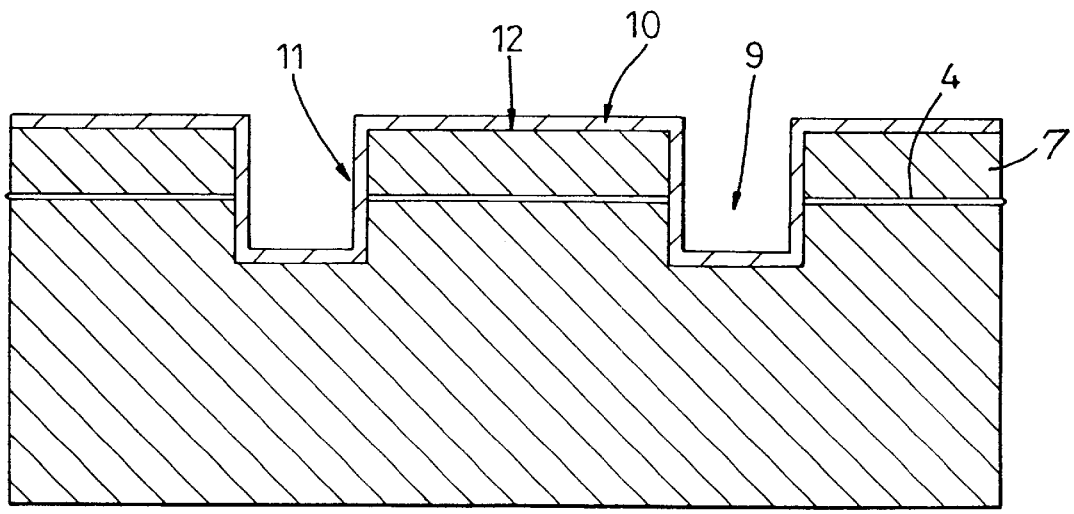
FIG. 4 is a schematic cross-sectional view of the wafer of FIG. 3 following deposition of a further dielectric layer.

With reference to FIG. 4, a dielectric layer 10 is deposited over both the newly etched facets 11 and the upper surface 12 of the semiconductor wafer. This dielectric layer 10 serves several functions. Firstly, as in prior art devices, the dielectric layer 10 serves to passivate the upper surface 12 of the wafer, and is used to define the contact window for electrical contact with the laser. Secondly, the dielectric layer 10 passivates the newly etched facets 11 and serves to protect them during subsequent processing. This is important since in Fabry-Perot devices these etched facets form the laser cavity and must be of high optical quality. If left unprotected the newly etched facets can be damaged in further processing of the wafer. Thirdly, the dielectric layer 10 serves as an electrically insulating layer over the p-n junction of the active layer 4 so that a further metal layer may be deposited on this facet (as described below) without causing an electrical short circuit across the p-n junction. Finally, the dielectric layer 10 also acts as an anti-reflection coating for the etched facet 11.

The dielectric layer 10 may successfully perform the first three functions when deposited in a wide range of thicknesses. However, in order to successfully act as an AR coating the thickness of the dielectric layer 10 must be controlled more carefully.

Various dielectric materials may be utilized for the dielectric layer 10 such as silicon dioxide or silicon nitride. As will be appreciated by those skilled in the art the thickness of the dielectric layer 10 can be optimized to minimize the reflectivity of the facet 11 and this reflectivity will depend, in addition to the thickness of the layer, on the refractive index of the dielectric layer, the refractive index of the semiconductor substrate, and the wavelength of operation of the laser. Multiple dielectric layers can also be employed to further reduce the reflectivity.

In the present embodiment a single layer of silicon dioxide is deposited by PECVD. Although PECVD is a generally a conformal, rather than a directional coating process, the ratio of the thickness of a deposited layer on a vertical surface such as the etched facet 11 to the thickness on a horizontal surface such as the upper surface of the semiconductor wafer 12 will depend on the deposition conditions, primarily the deposition pressure. The ratio of horizontal and vertical layer thicknesses must thus be determined experimentally for any given set of deposition conditions. Generally the horizontal layer thickness will be greater than the vertical layer thickness, and the Applicants have found that the vertical layer of thickness is between 30% and 70% of the horizontal layer thickness. A silicon dioxide layer thickness of 2200 Å on the etched facet has been found to provide an effective reduction in facet reflectivity (approximately 5% at 1300 nm). In order to achieve this layer of thickness on the facet surface, a 3000 Å thick layer of silicon dioxide is deposited on the upper surface 12 on the semiconductor wafer.

Figure 5:
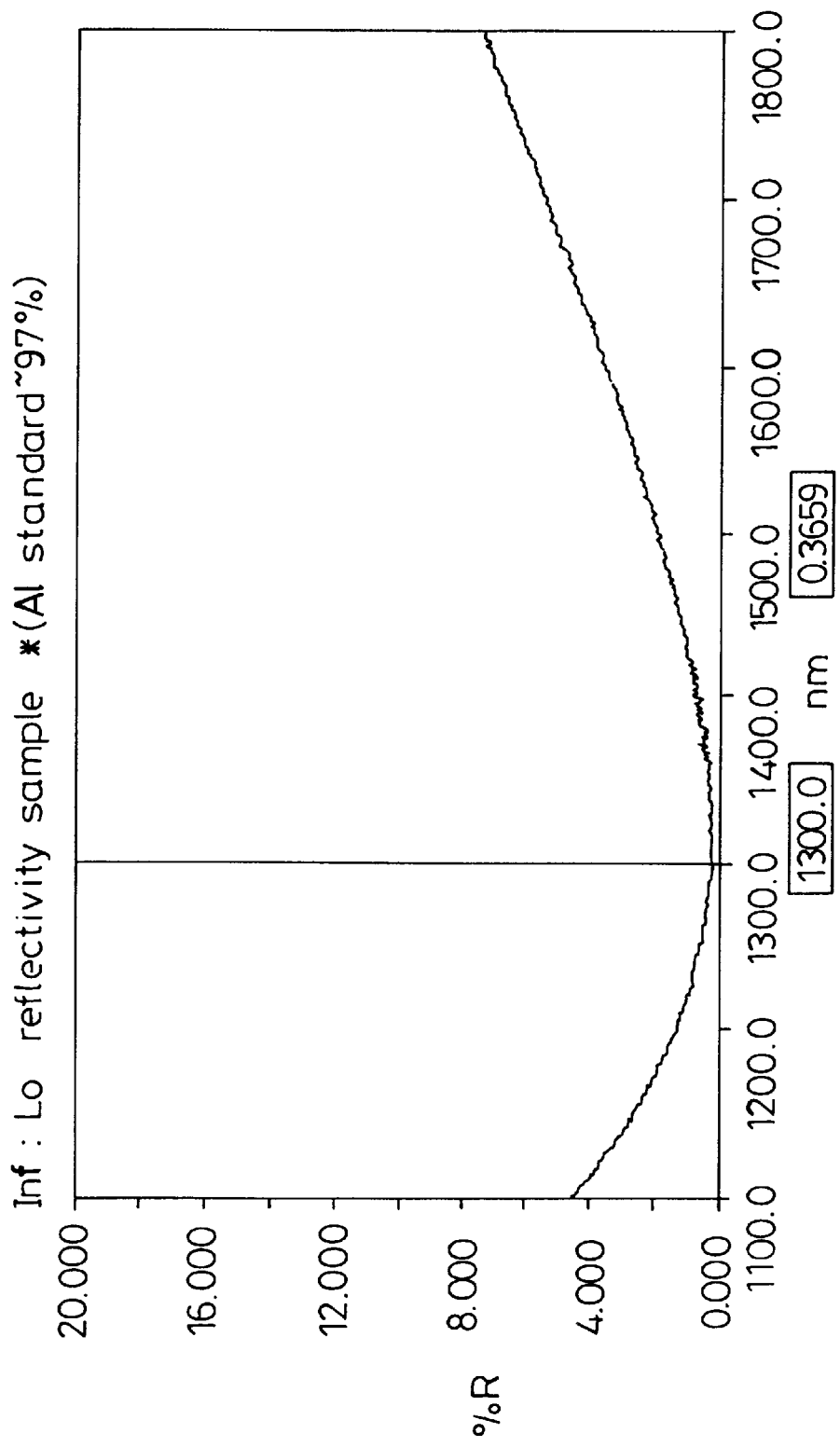
FIG. 5 shows the experimentally measured reflectivity of a 1650 Å thick layer of silicon nitride against wavelength.

Alternatively a silicon nitride layer, having a refractive index of between 1.85 and 2, may be utilized to achieve lower reflectivities. The optimum thickness for silicon nitride at 1300 nm has been found to be 1600 Å on the facet, thus requiring deposition of a 2200 Å thick layer of silicon nitride on the upper wafer surface 12. FIG. 5 is an experimental graph showing the variation in reflectivity of such a layer of silicon nitride with wavelength. From FIG. 5 it can be seen that the reflectivity is approximately 0.5% at 1300 nm.

4. Metal Layer Deposition

Conventionally two metal coatings are deposited on the upper surface of the semiconductor in order to make electrical contact with the laser. A first metal coating comprises a titanium (Ti) deposition followed by a platinum (Pt) deposition. The Ti adheres well to the semiconductor, while the Pt provides a barrier to the diffusion of gold into the semiconductor which is generally undesirable. This first metal coating is followed by a second metal coating, again comprised of two deposited metals. Titanium is again deposited first for its adherence and is followed by a gold deposition which forms the contact surface for making electrical contact with the laser.

In accordance with the invention either or both of these two metal coatings may be deposited on both the etched facets 11 and the upper surface 12 of the semiconductor wafer. If it is desired to fabricate a laser having HR coated facets, deposition of the first metal coating of Ti/Pt on the etched facets is advantageous since the Pt protects the active region from the latter deposited Au. However, because Pt can be difficult to remove once deposited, if it is desired to form a laser with AR coated or uncoated facets, it is preferable to prevent the deposition of the Ti/Pt coating on the etched facets 11: it is nonetheless possible using liftoff techniques to deposit Pt layers selectively onto facets. Accordingly the following process steps in this embodiment result in the Ti/Pt coating being deposited on only the upper semiconductor wafer surface 12 and the Ti/Au coating being deposited on both the etched facets 11 and the upper semiconductor wafer surface 12.

Figure 6A:
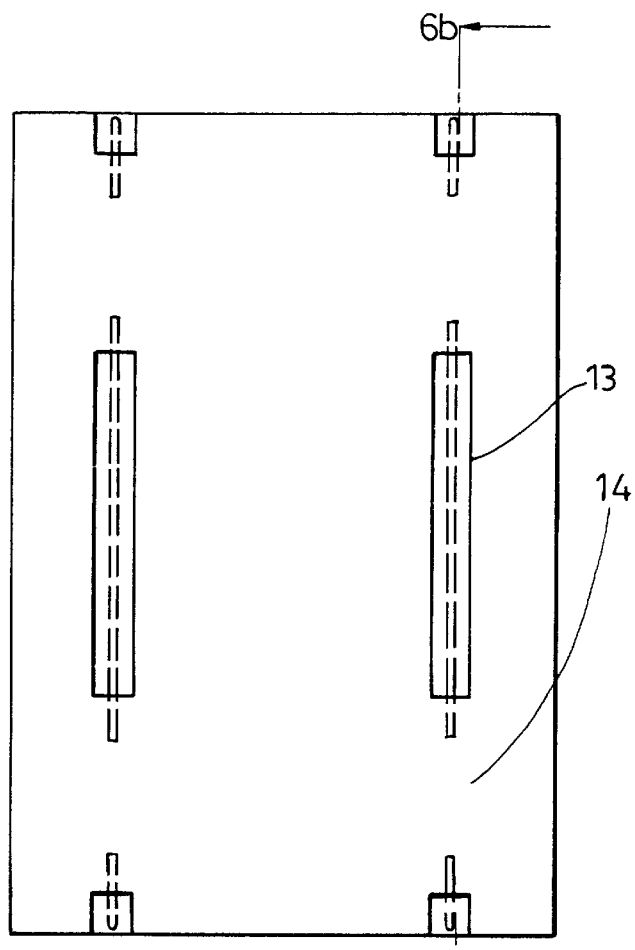
FIG. 6a is a schematic plan view of the wafer of FIG. 4 following the deposition of a resist and the definition of contact windows within the resist.
Figure 6B:
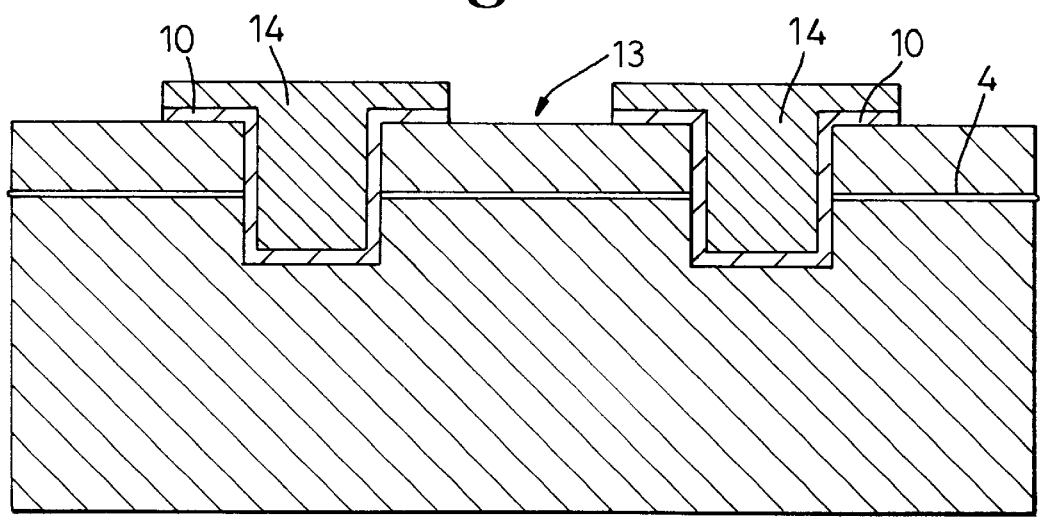
FIG. 6b is a schematic cross-sectional view along the line 6b of the wafer of FIG. 6a, FIG. 7 is a schematic plan view of the wafer of FIG. 6a, illustrating an area exposed following the re-masking of the resist.

Having deposited a dielectric layer 10 over the whole of the semiconductor wafer surface, a resist is deposited and patterned by photolithography to form a contact window 13 above each of the active mesa stripes 4 as shown in FIG. 6a. A particularly thick resist, of 6.2 m is utilized so as to planarize the wafer surface in order to prevent undesired etching of the dielectric layer 10 from the etched facets 11. The contact window 13 is then transferred from the photo-resist layer 14 to the dielectric layer 10 by a $CHF_3/O_2$ reactive ion etch. The resulting structure, shown is FIG. 6b, comprises dielectric layer 10 covering the etched facets 11 and defining a contact window 13 for each laser device. A photo-resist layer 14 remains coincident with the dielectric layer 10.

Figure 7:
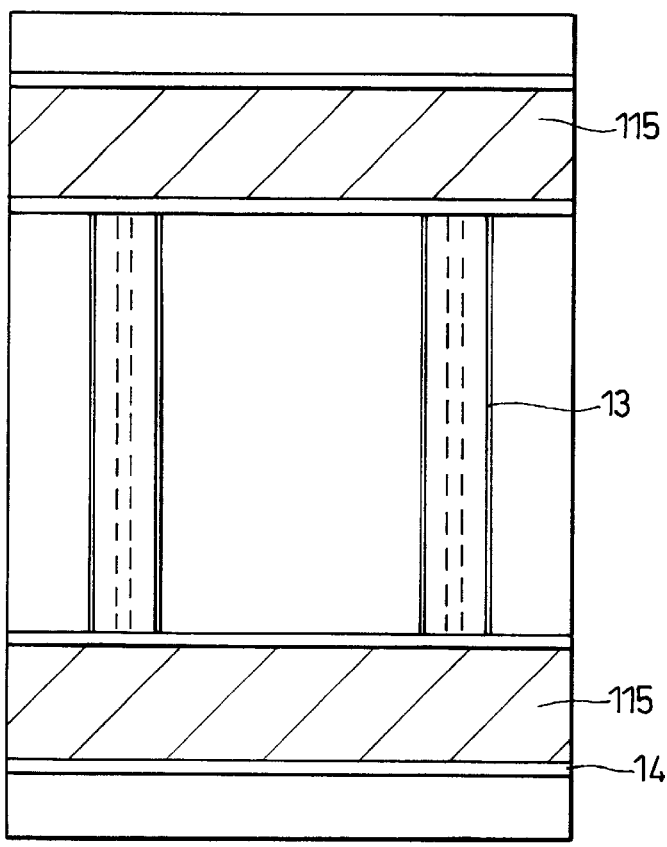

The photo-resist layer 14 is remasked and patterned for a second time using a mask, the etching aperture of which is referenced 115 in FIG. 7. As can be seen from FIG. 7, following this second patterning an edge of the dielectric layer 10 will be exposed around the contact window 13. This edge corresponding to layer surface 15 in FIG. 8, allows a subsequently deposited metal layer to overlap both the upper surface 12 of the semiconductor wafer and the dielectric layer 10. This overlap ensures that subsequently deposited Au does not diffuse into the active region of the laser.

Figure 8:
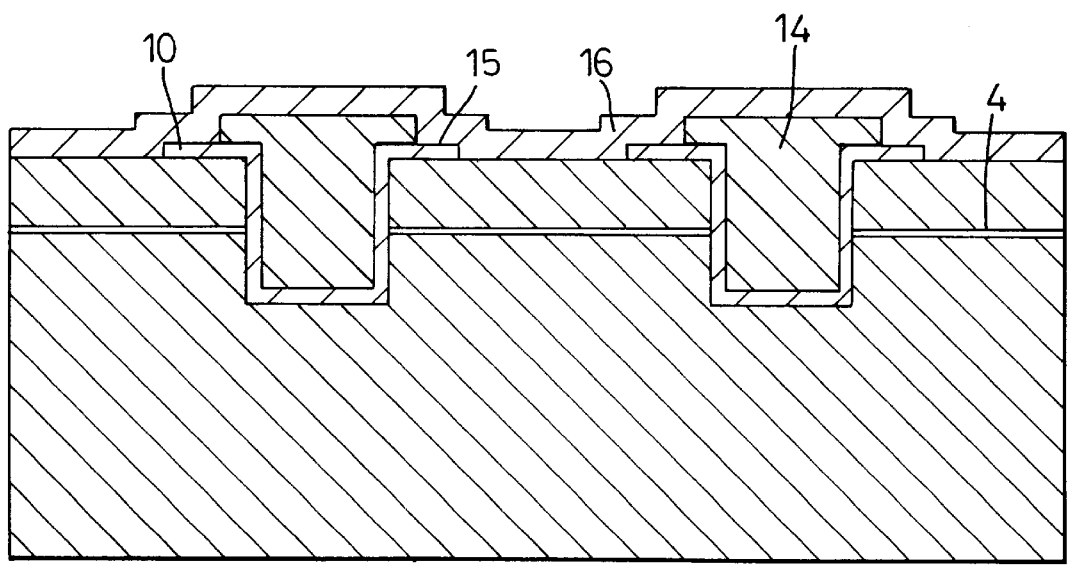
FIG. 8 is a schematic cross-sectional view of the wafer FIG. 7 following the deposition of a first metal layer.
Figure 9:
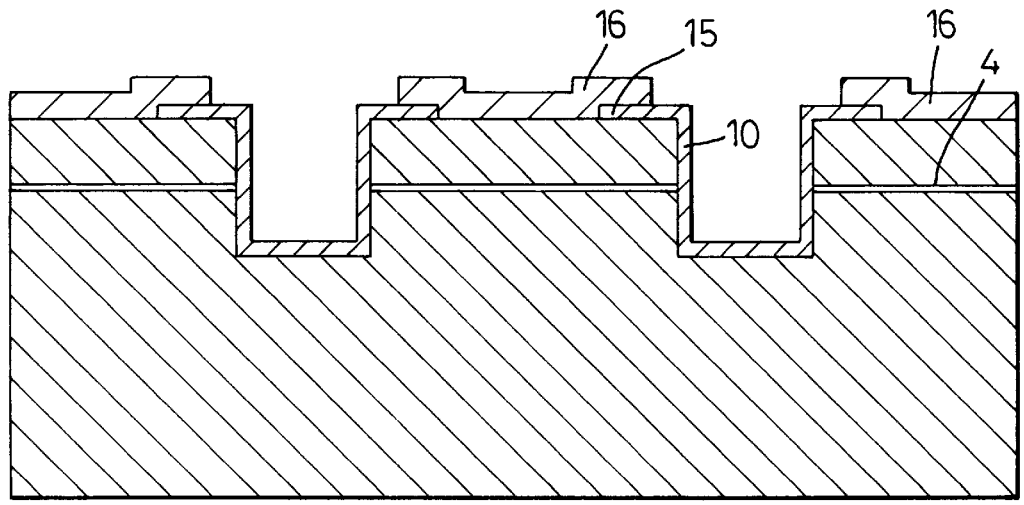
FIG. 9 is a schematic cross-sectional view of the wafer of FIG. 8 following the lift-off of photo-resist from the facet trenches.

Deposition of such a metal layer is now described. A Ti/Pt layer 16 is deposited over the whole of the upper surface of the semiconductor wafer, as shown in FIG. 8, by evaporation. Conventional thicknesses of Ti and Pt for electrical contacting purposes, respectively 600 Å and 1250 Å are utilized. The remaining blocks of the photo resist layer 14 are then removed and simultaneously "lift off" the part of the Ti/Pt layer which was deposited above the facet trenches 9. The resulting structure, shown in FIG. 9, has a Ti/Pt first contacting metal layer 16 which is aligned to the contact window 13 and overlaps the layer surface 15 of the dielectric layer 10 but does not cover the etched facets 11.

If it is desired to coat for example only one of the etched facets of each laser with Ti/Pt (for the reasons discussed above) then the resist layer 14 is simply deposited over alternate facet trenches 9.

Figure 10:
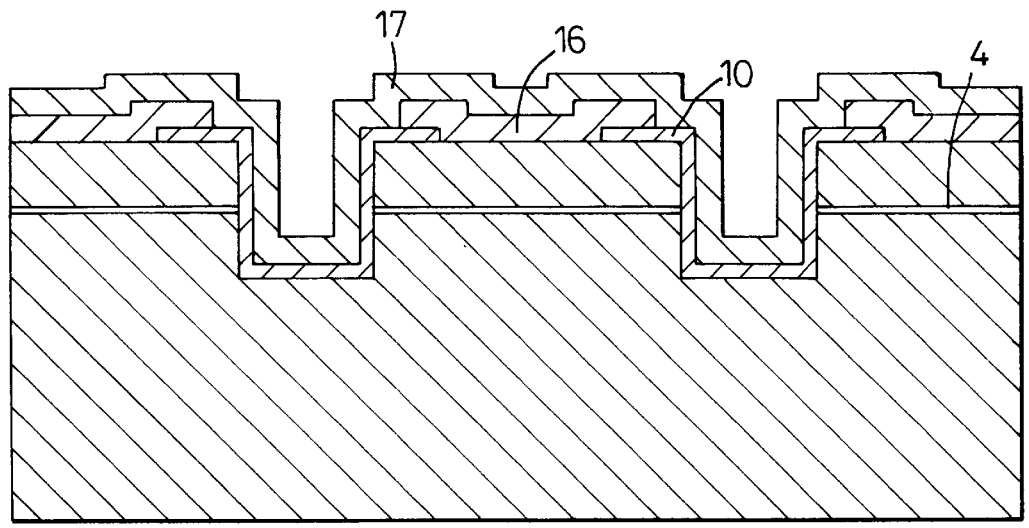
FIG. 10 is a schematic cross-sectional view of the wafer of FIG. 9 following the deposition of a second metal layer.
Figure 11:
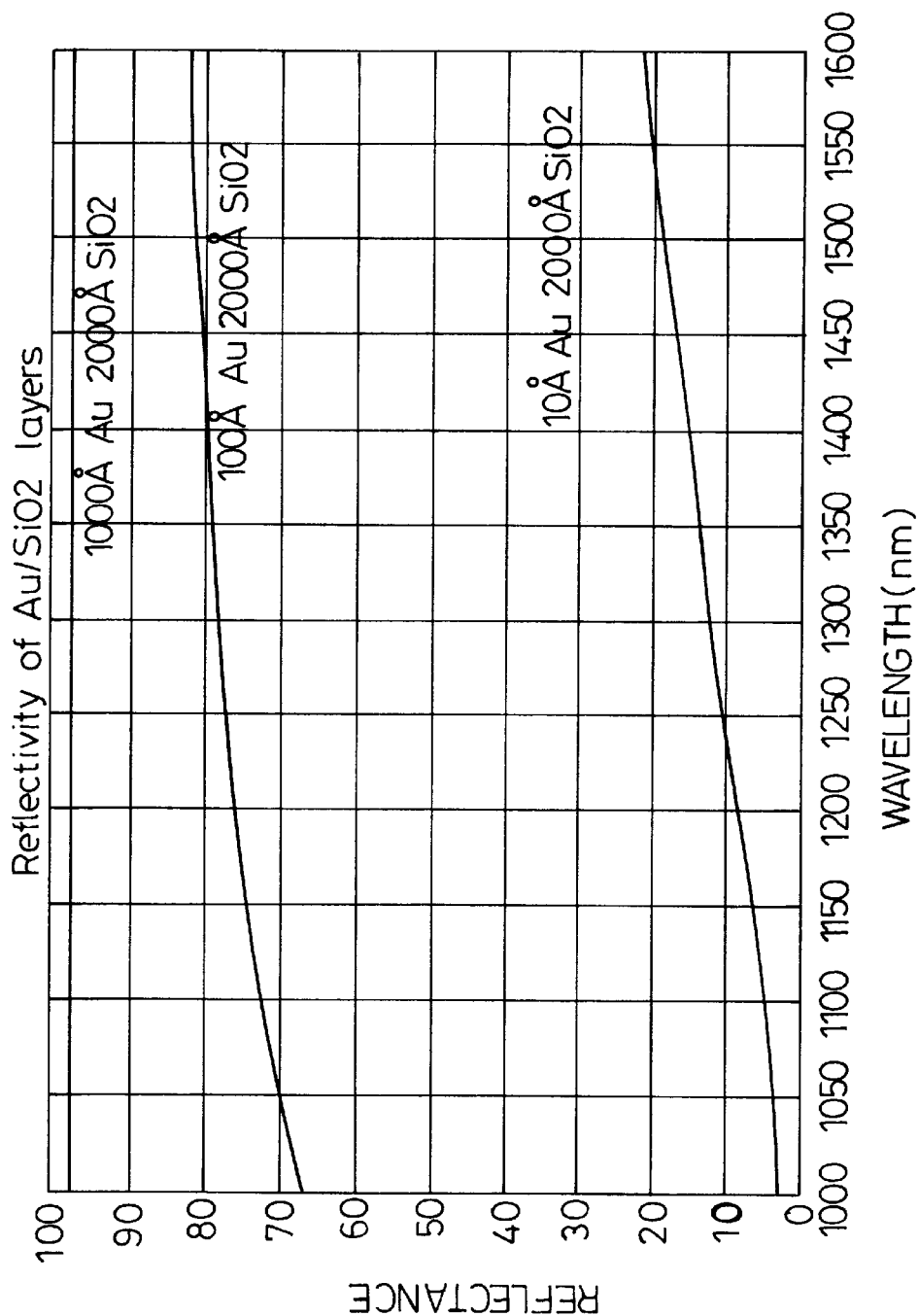
FIG. 11 is a graph showing the theoretically calculated reflectivity of Au layers of various thicknesses on a 2000 Å silicon dioxide layer.
Figure 12:
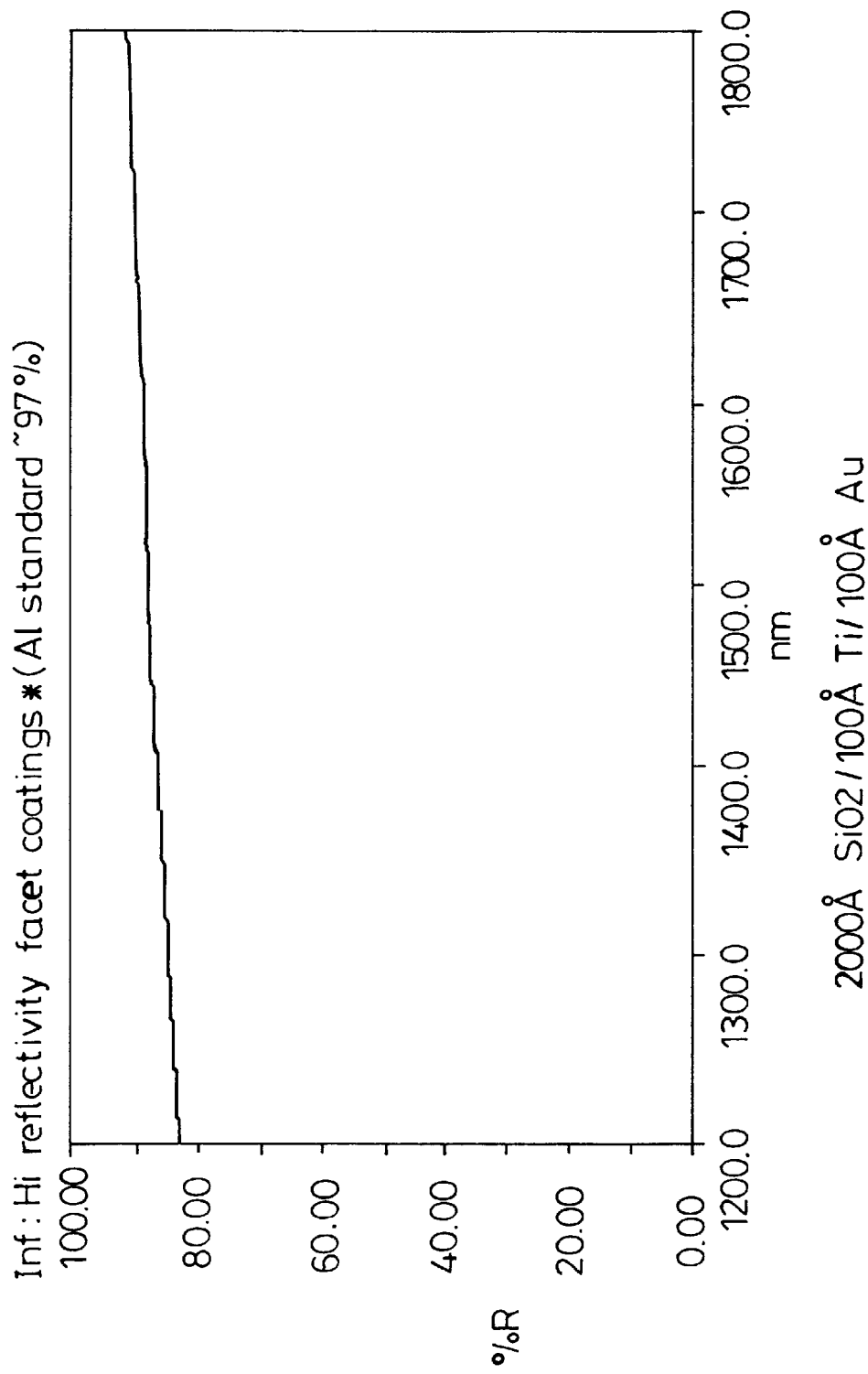
FIG. 12 is a graph of the experimentally measured reflectivity against wavelength of an approximately 100 Å/100 Å thick Ti/Au layer on top of a 2000 Å thick silicon dioxide layer.
Figure 13:
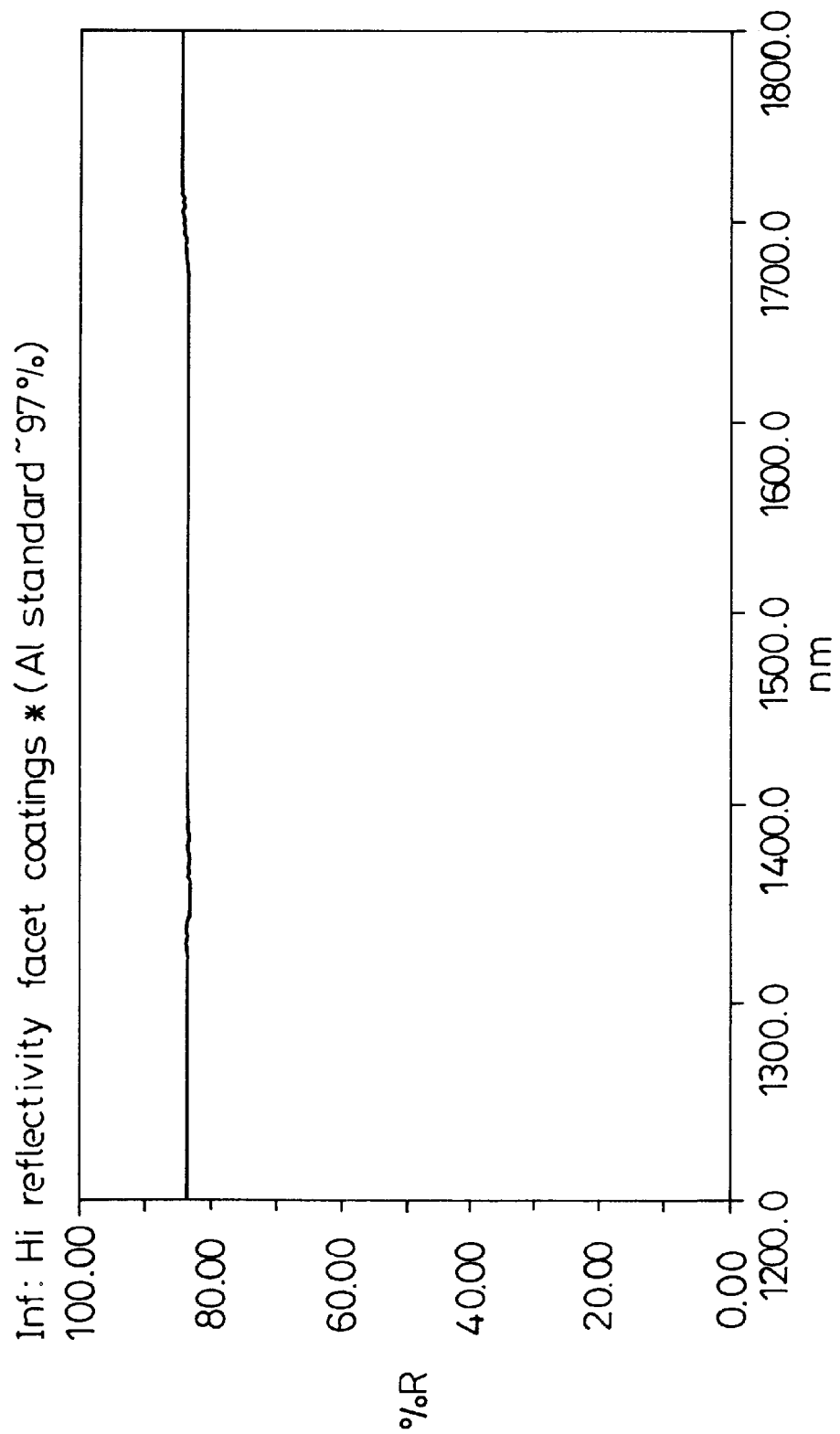
FIG. 13 is a graph of the experimentally measured reflectivity of a Ti/Pt layer of approximate thickness 600/1250 Å, on a 2000 Å thick silicon dioxide layer.

Referring to FIG. 10, a second metal layer 17 comprising Ti/Au is sputtered over the whole of the semiconductor wafer and coats both the etched facets 11 and the upper surface of the wafer. This second metal coating 17 serves both as the p-contact metallization for the laser and as an HR facet coating. The thicknesses of the Ti and Au deposited must therefore be optimized to give the desired facet reflectivity. The optimum level of reflectivity for a Fabry-Perot laser facet depends on the design criteria for the laser (e.g., the relative importance of a low threshold current, high output power and good temperature performance) since these are to some extent opposing requirements. However, often a facet reflectivity of between 80% and 90% is desired for a Fabry-Perot laser. FIG. 11 shows the theoretically calculated reflectivity against wavelength of Au layers of 10 Å, 100 Å and 1000 Å thickness, deposited in each case on top of a 2000 Å $SiO_2$ layer. From these plots it can be seen that in order to achieve reflectivities of 80% to 90%, layers of a few hundred Angstroms thickness are required. The applicants have found that Ti/Au layers of 100 Å/300 Å are effective and, if a Ti/Pt layer is utilized on facets, thicknesses of 600/1250 Å are effective. Many other effective thicknesses and thickness combinations are of course possible. FIG. 12 is a graph of the experimentally measured reflectivity against wavelength of an approximately 100 Å/100 Å thick Ti/Au layer on top of a 2000 Å silicon dioxide layer, and FIG. 13 is a similar graph for an approximately 600 Å/1250 Å Ti/Pt layer also on top of a 2000 Å A silicon dioxide layer.

Despite the use of generally conformal coating techniques such as sputtering, the thickness of a deposited metal layer is less on vertical surfaces than on horizontal surfaces. The ratio of these thicknesses will obviously depend on the deposition conditions (eg., the pressure of the gas chamber in which sputtering takes place and the RF power of the sputterer used. The metal deposition discussed above was carried out with an argon gas pressure of 10 mT and flow of 41 sccm and RF powers of 400 W for Au and 600 W for Ti were used. When using these parameters the Applicants have found that the thickness on vertical surfaces is between 10% and 30% of the thickness deposited on horizontal surfaces. Hence, in order to achieve desired reflectivities of 88%, Ti/Au thicknesses of approximately 500 Å/2500 Å on horizontal surfaces are deposited. Where Ti/Pt coatings are required on etched facets, thicknesses of approximately 500 Å/6250 Å deposited on horizontal surface have been found to achieve the desired reflectivity of vertical facets.

5. Removal of Facet Coatings

Once the etched facets have been coated with both a dielectric and a metal layer they will all have high reflectivity. A low reflectivity or uncoated facet (~30% reflectivity) may be formed by removing respectively the metal layer, or the metal layer and the dielectric layer from selected facets.

Figure 14A:
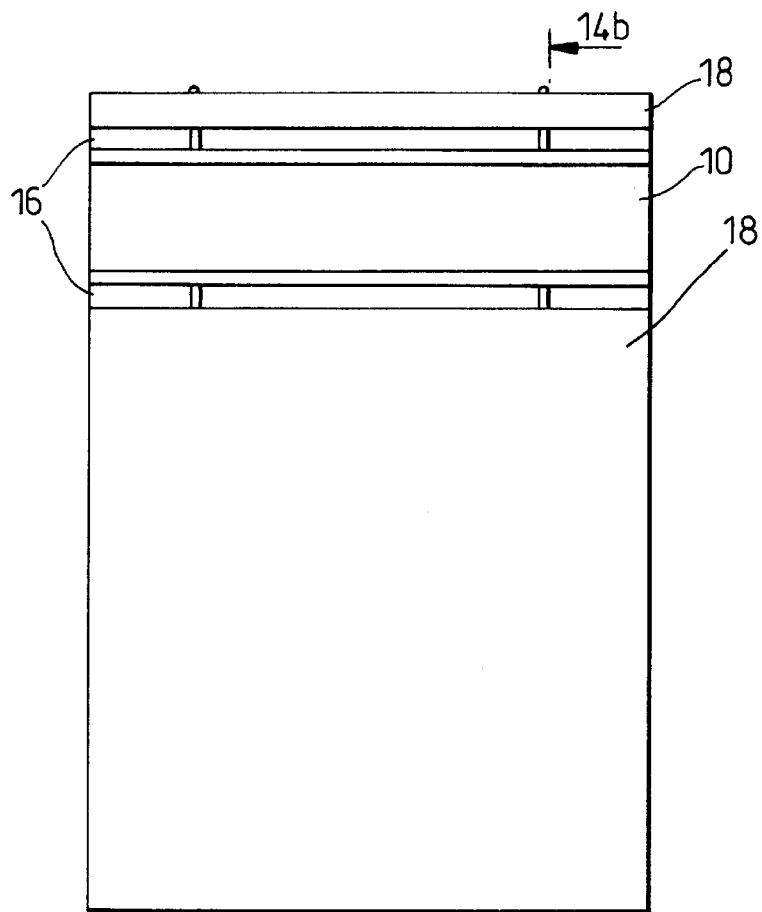
FIG. 14a is a schematic plan view of the wafer of FIG. 10 following the deposition of an etch mask over alternate facet trenches and the removal of metal layers from alternate etched facets.
Figure 14B:
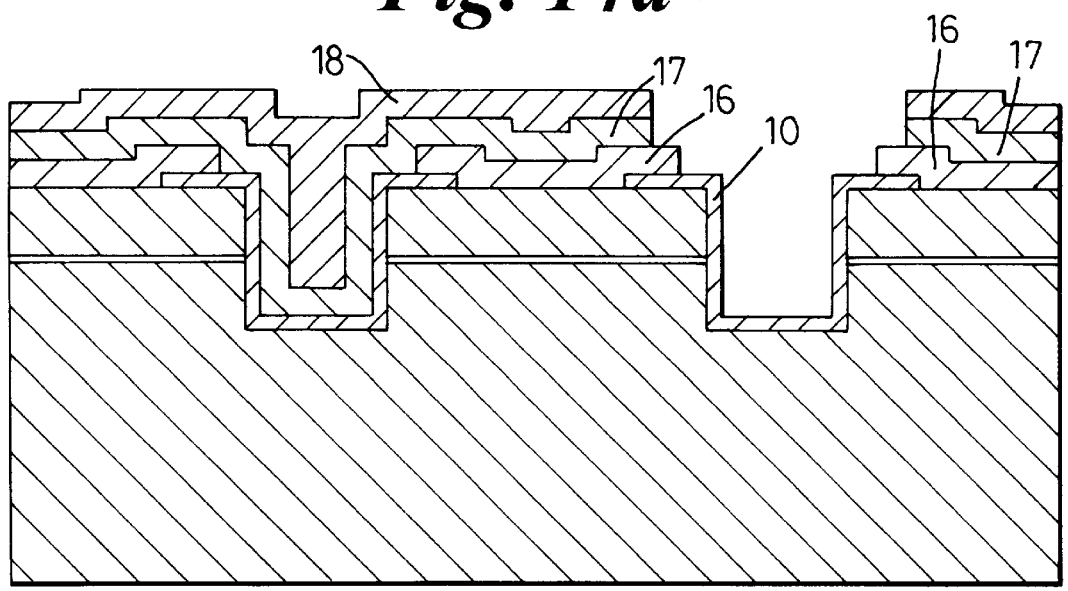
FIG. 14b is a schematic cross-sectional view of the wafer of FIG. 14a along the line 14b.

An appropriate etch mask 18 is used to expose alternate facet channels to a wet etch of I/KI for Au layers and 10% HF for Ti and dielectric layers. If the resulting lasers are desired to have one HR and one AR coated facet the HF is washed off immediately so that only the Ti/Au metal layer 17 is removed as shown in FIG. 14b. If an uncoated facet is required the dielectric layer 10 must be removed which can be achieved simply by leaving the HF in contact with the layer for the appropriate time. Etch rates for silicon dioxide are approximately 20 Å/sec, while silicon nitride etches at approximately 2 Å/sec.

6. Cleaving Lasers

Figure 15:
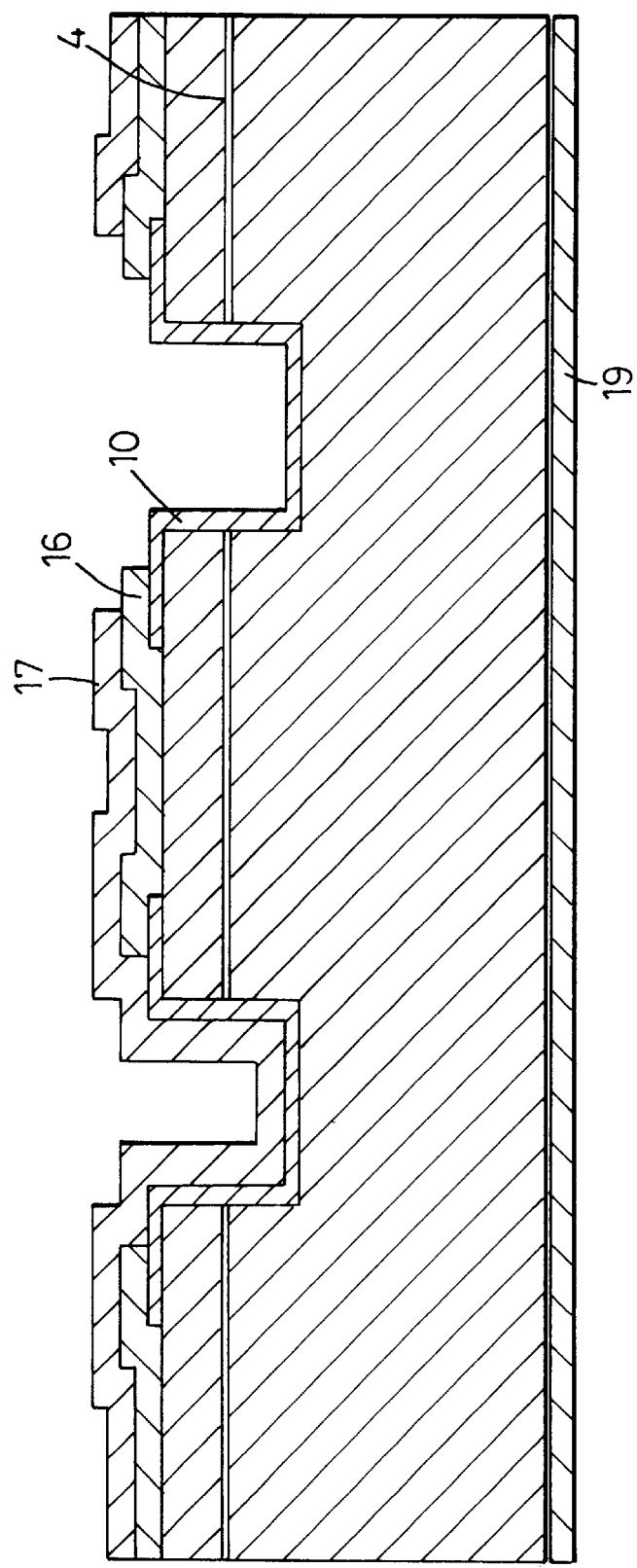
FIG. 15 is a schematic cross-sectional view of the wafer of FIG. 14 following the removal of the etch mask.

Any remaining resist is removed, the wafer is thinned to approximately 100 m and an n-side metallization layer 19 is deposited as shown in FIG. 15.

Figure 16A:
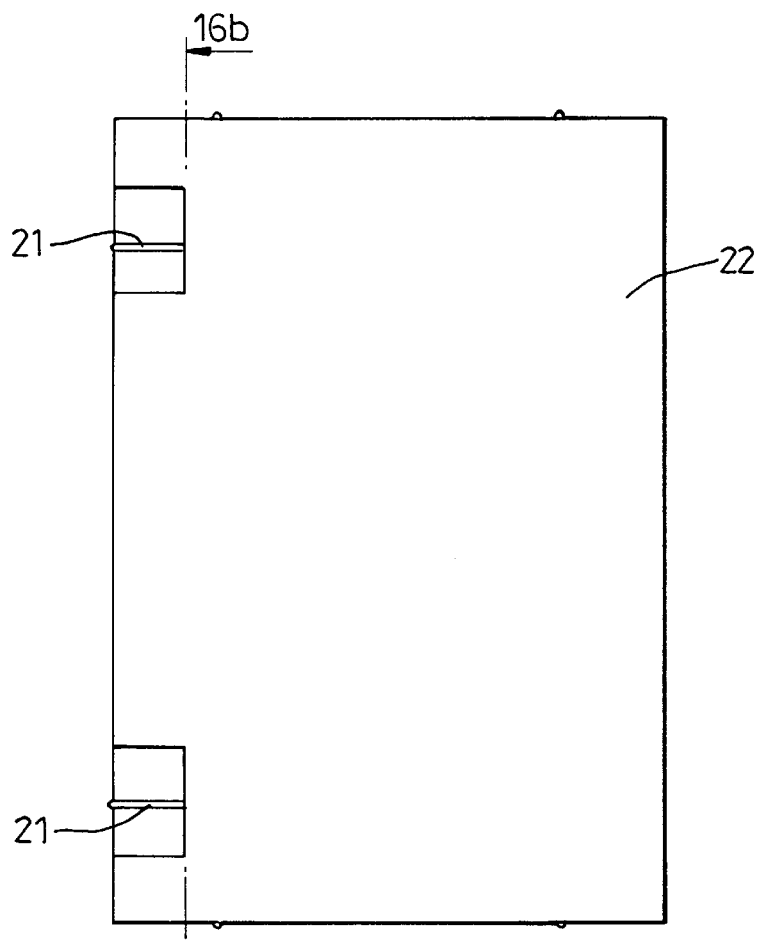
FIG. 16a is a schematic plan view of the wafer FIG. 15 following the definition of cleave initiators.
Figure 16B:
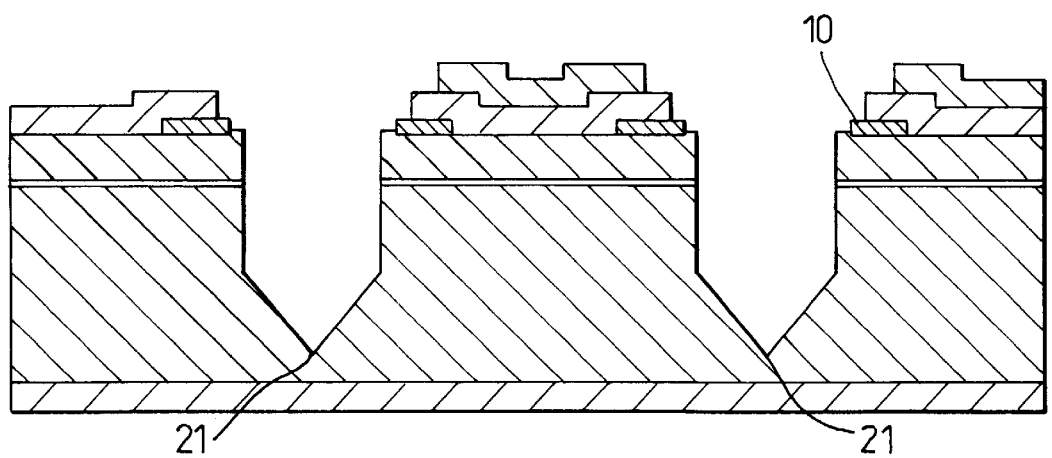
FIG. 16b is a schematic cross-sectional view of the wafer of FIG. 16a along the line 16b.

The wafer must now be broken up into individual lasers. A mask 22 is deposited over the whole of the wafer except for the ends 21 of the facet trenches 9 close to the edge 20 of the wafer. A HBr wet etch is used to form self aligned cleave initiators 21 at the ends of the trenches 9. The HBr etch etches along the (111) planes of the InP substrate starting from each corner of the trench as shown in FIG. 16. The two etch planes meet at the center of the trench so that the cleave initiator thus formed is automatically aligned between the laser devices.

Figure 17:
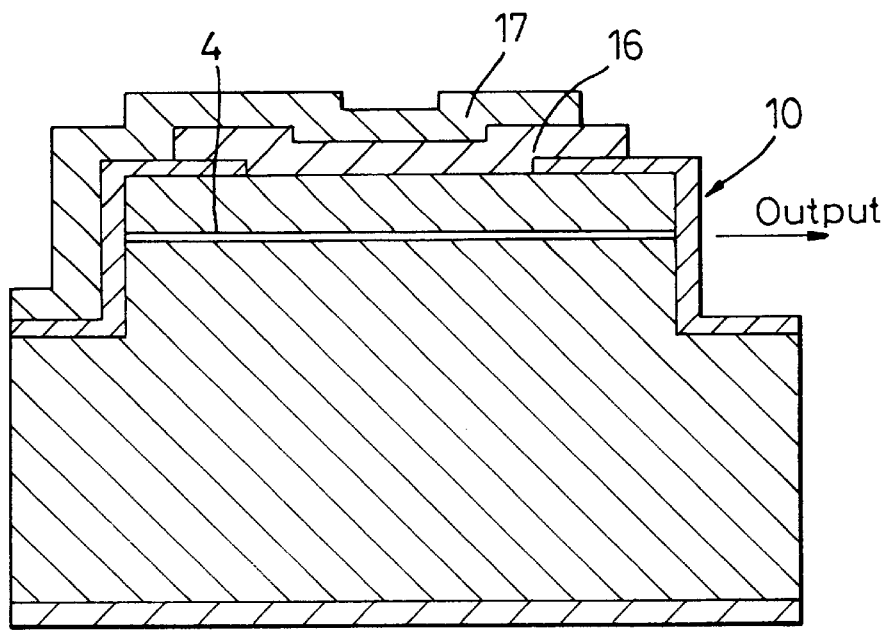
FIG. 17 is a schematic cross-sectional view of a single laser device.

The bars of lasers are cleaved along the facet trenches utilizing the cleave initiators and are then scribed and diced to give individual lasers as shown in FIG. 17.

DETAILED DESCRIPTION OF A PHOTODETECTOR EMBODIMENT

In a second embodiment of the invention an edge-entry photodiode is coated both on its input facet and on its upper surface with a dielectric layer.

Figure 18:
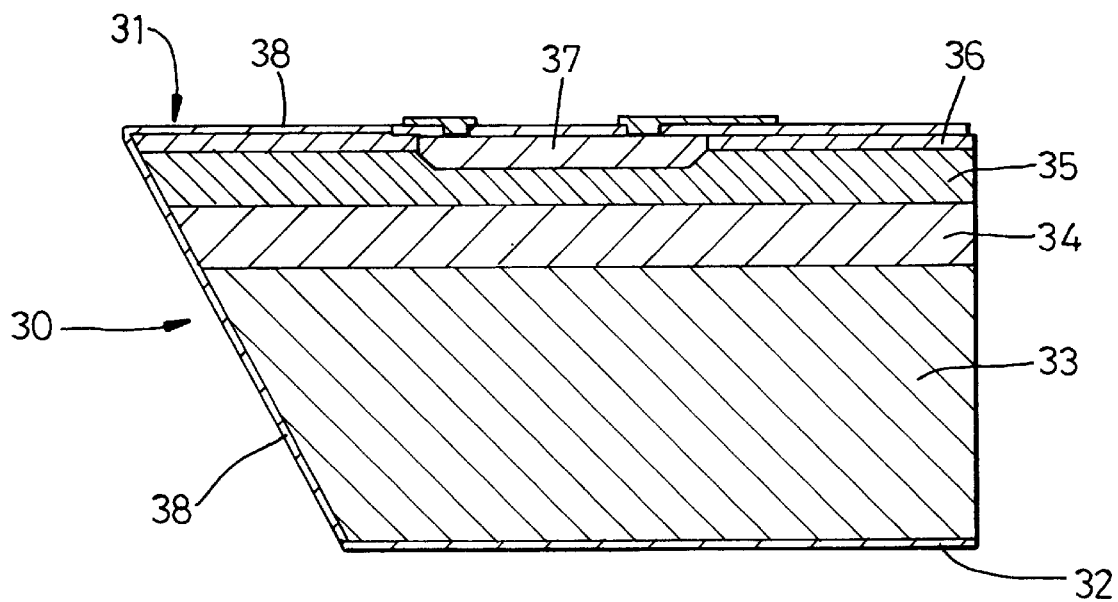
FIG. 18 is a schematic cross-sectional view of a photo-detector fabricated according to a second embodiment of the present invention.

Although any known design of edge entry photo-diode may be employed in conjunction with the invention, the present embodiment, as shown in FIG. 18, utilizes an input facet 30 which is formed at an acute angle with the upper surface 31 of the semiconductor wafer. This angle causes input light which is initially parallel to the upper surface 31 of the photo-diode to be refracted at the input facet 30 towards the active area 32 of the photo-diode.

The fabrication of the photo-diode, as for the above described semiconductor laser, is conventional. The photo-diode comprising a metal n-contact layer 32 at the bottom of a n+InP substrate 33, a InP buffer layer 34, a InGaAs layer 35 and an InP capping layer 36. The active, light absorbing region 37 is formed by the diffusion of zinc into the InGaAs layer 35. The facet 30 is wet etched using a hydrobromic acid etchant which etches along the (111)A plane in indium phosphide. The angle between the etched facet and the upper surface 31 of the wafer is 54° 44'. Following etching of the input facet 30 a 2200 Å thick layer 38 of silicon nitride is deposited on both the upper surface 31 and the input facet 30 of the photo-diode. The thickness of this layer 38 on the input facet 30 will again depend on the deposition conditions utilized, and can again be optimized to give the desired reflectivity at the desired operating wavelength. As with the laser embodiment described above, the same silicon nitride layer 31 acts as the surface passivation and contact window defining layer on the upper surface 31 of the semiconductor wafer and as an AR coating on the input facet. The use of a single deposited layer for these two different functions thus serves to reduce the number of fabrication steps and to avoid the necessity of handling individual devices in order to coat their facets.

Photo-diodes fabricated in accordance with the present embodiment have been measured to have responsivities of 1.0 A/W. This compares well with identical photodiodes without coated input facets which have been measured to have responsivities of 0.7 A/W.

Having described the invention with respect to two embodiments thereof, modification will now suggest itself to those skilled in the art. As such, the invention is not to be limited to the disclosed embodiments, except as required by the following claims.

What is claimed is:

1. A method of fabricating a semiconductor optical device, the method comprising the steps of:
   depositing planar layers of semiconductor material to form a semiconductor wafer having an optically active region,
   etching through the optically active region to form a plurality of facets, and
   simultaneously coating at least one facet and an upper surface of the semiconductor wafer with a coating layer having a thickness and composition such that, during subsequent processing of the semiconductor wafer, said coating layer passivates said at least one facet and, during operation of the semiconductor device, the coating layer acts both as a facet coating and as a wafer surface coating, wherein the facet coating electrically insulates a portion of the optically active region contiguous therewith.

2. A method of fabricating a semiconductor optical device as claimed in claim 1, wherein said depositing step comprises depositing planar layers of semiconductor material to form a semiconductor wafer having a light absorbing region and said etching step comprises etching input facets for the semiconductor optical device.

3. A method of fabricating a semiconductor optical device as claimed in claim 1, wherein said depositing step comprises depositing planar layers of semiconductor material to form a semiconductor wafer having a light emitting region and said etching step comprises etching output facets for the semiconductor optical device.

4. A method of fabricating a semiconductor optical device as claimed in claim 1, wherein the coating layer comprises a dielectric material.

5. A method of fabricating a semiconductor optical device as claimed in claim 4, wherein the dielectric coating layer acts as a low reflectivity facet coating and as a passivating wafer surface coating.

6. A method of fabricating a semiconductor optical device as claimed in claim 1, wherein the coating layer comprises a metal material.

7. A method of fabricating a semiconductor optical device as claimed in claim 6, wherein the metal coating layer acts as a high reflectivity facet coating and as an electrical contacting wafer surface coating.

8. A method of fabricating a semiconductor optical device as claimed in claim 1, wherein two said coating layers are deposited and wherein the first coating layer is of a dielectric material and the second coating layer is of a metal material.

9. A method of fabricating a semiconductor optical device as claimed in claim 8, comprising the further step of selectively removing the second coating layer from at least one said facet.

10. A method of fabricating a semiconductor optical device as claimed claim 8, comprising the further step of selectively removing both the second coating layer and the first coating layer from at least one said facet.

11. A semiconductor device fabricated by the method claimed in claim 1, wherein the semiconductor device is fabricated from a substantially planar semiconductor wafer, the semiconductor device having at least one etched facet, and a substantially conformal coating which covers at least a part of the etched facet and a part of an upper surface of the semiconductor device.

12. A semiconductor device as claimed in claim 11, wherein the semiconductor device comprises a laser, said facet is an output facet of the laser and the substantially conformal coating comprises a dielectric material and forms a low reflectivity facet coating and a passivating wafer surface coating.

13. A semiconductor laser device as claimed in claim 12, wherein a second said substantially conformal coating comprises a metal material and forms a high reflectivity facet coating and an electrical contacting wafer surface coating.

14. A semiconductor laser device as claimed in claim 13 having two etched facets, wherein a first facet is at least partly covered by said dielectric conformal coating and a second facet is at least partly covered by both said dielectric conformal coating and said metal conformal coating.

15. A semiconductor device as claimed in claim 11, wherein the semiconductor device comprises a photodetector, said facet is an input facet of the photodetector and the substantially conformal coating comprises a dielectric material and forms a low reflectivity facet coating and a passivating wafer surface coating.

16. A semiconductor photodetector device as claimed in claim 15, wherein the input facet forms an acute angle with the upper surface of the device.

17. A method of fabricating a semiconductor optical device as claimed in claim 2, wherein the coating layer comprises a dielectric material.

18. A method of fabricating a semiconductor optical device as claimed in claim 3, wherein the coating layer comprises a dielectric material.

19. A method of fabricating a semiconductor optical device as claimed in claim 2, wherein the coating layer comprises a metal material.

20. A method of fabricating a semiconductor optical device as claimed in claim 3, wherein the coating layer comprises a metal material.

21. A method as claimed in claim 4, wherein the dielectric material comprises silicon dioxide or silicon nitride.

22. A semiconductor device fabricated by a method comprising the steps of:
   providing a semiconductor wafer comprising layers of semiconductor material, wherein the semiconductor wafer has an optically active region, and an upper surface;
   etching through the optically active region to form a facet; and
   simultaneously coating the facet and the upper surface of the semiconductor wafer with a coating layer comprising a dielectric material;
   wherein the semiconductor device comprises the semiconductor wafer with the facet and the coating layer, wherein the coating layer comprises the dielectric material, wherein the coating layer covers at least a part of the facet and at least a part of the upper surface of the semiconductor wafer;
   wherein the semiconductor device comprises a laser, wherein the facet is an output facet of the laser, and wherein the coating layer acts as a low reflectivity facet coating and as a passivating coating of the upper surface of the semiconductor wafer.

23. A device as claimed in claim 22, wherein the dielectric material comprises silicon dioxide or silicon nitride.

24. A device as claimed in claim 22, wherein the coating layer comprises multiple dielectric layers.

25. A semiconductor device as claimed in claim 22, wherein the coating layer comprises a first coating layer and a second coating layer, wherein the first coating layer comprises the dielectric material.

26. A semiconductor device as claimed in claim 22, wherein the optically active region comprises a light-emitting region.

27. A semiconductor device fabricated by a method comprising the steps of:
   providing a semiconductor wafer comprising layers of semiconductor material, wherein the semiconductor wafer has an optically active region and an upper surface;
   etching through the optically active region to form a facet; and
   simultaneously coating the facet and the upper surface of the semiconductor wafer with a coating layer comprising a dielectric material;
   wherein the semiconductor device comprises the semiconductor wafer with the facet and the coating layer, wherein the coating layer comprises the dielectric material, wherein the coating layer covers at least a part of the facet and at least a part of the upper surface of the semiconductor wafer;
   wherein the semiconductor device comprises a photodetector, wherein the facet is an input facet of the photodetector, and wherein the coating layer acts as a low reflectivity facet coating and as a passivating coating of the upper surface of the semiconductor wafer.

28. A device as claimed in claim 27, wherein the input facet forms an acute angle with the upper surface of the semiconductor wafer.

29. A semiconductor device as claimed in claim 27, wherein the dielectric material comprises silicon dioxide or silicon nitride.

30. A semiconductor device as claimed in claim 27, wherein the coating layer comprises multiple dielectric layers.

31. A semiconductor device as claimed in claim 27, wherein the coating layer comprises a first coating layer and a second coating layer, wherein the first coating layer comprises the dielectric material.

32. A semiconductor device as claimed in claim 27, wherein the optically active region comprises a light-absorbing region.

* * * * *